(12) United States Patent
Coutts et al.

(10) Patent No.: US 9,582,027 B2
(45) Date of Patent: Feb. 28, 2017

(54) CLOCK SWALLOWING DEVICE FOR REDUCING VOLTAGE NOISE

(71) Applicant: QUALCOMM Incorporated, San Diego, CA (US)

(72) Inventors: Ryan Michael Coutts, Carlsbad, CA (US); Dipti Ranjan Pal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 229 days.

(21) Appl. No.: 14/300,084

(22) Filed: Jun. 9, 2014

(65) Prior Publication Data

US 2015/0355671 A1    Dec. 10, 2015

(51) Int. Cl.

| | | |
|---|---|---|
| *G06F 1/04* | (2006.01) | |
| *G06F 1/14* | (2006.01) | |
| *G06F 1/08* | (2006.01) | |
| *G06F 1/20* | (2006.01) | |
| *G06F 1/32* | (2006.01) | |
| *H03K 23/66* | (2006.01) | |
| *H03L 1/02* | (2006.01) | |
| *H03K 21/02* | (2006.01) | |

(52) U.S. Cl.
CPC .............. *G06F 1/08* (2013.01); *G06F 1/206* (2013.01); *G06F 1/324* (2013.01); *H03K 23/662* (2013.01); *H03L 1/022* (2013.01); *H03K 21/026* (2013.01); *Y02B 60/1217* (2013.01)

(58) Field of Classification Search
CPC ........................................................ G06F 1/08

USPC ......................................................... 713/503
See application file for complete search history.

(56) References Cited

U.S. PATENT DOCUMENTS

| | | |
|---|---|---|
| 4,580,282 A | 4/1986 | Lawton et al. |
| 4,780,890 A | 10/1988 | Kane |
| 5,790,609 A | 8/1998 | Swoboda |
| 6,490,329 B2 | 12/2002 | Nguyen et al. |
| 7,282,969 B2 | 10/2007 | Shin et al. |
| 7,404,099 B2 | 7/2008 | Huang |
| 8,132,041 B2 | 3/2012 | Komninakis et al. |
| 8,350,595 B2 | 1/2013 | Kanno et al. |
| 8,450,990 B2 | 5/2013 | Shi et al. |
| 8,631,262 B2 | 1/2014 | Park |
| 8,729,947 B2 | 5/2014 | Hwang et al. |
| 2004/0064752 A1* | 4/2004 | Kazachinsky ........ G06F 1/3203 713/500 |

(Continued)

FOREIGN PATENT DOCUMENTS

| | | |
|---|---|---|
| WO | 0026747 | 5/2000 |
| WO | WO-03073244 A2 | 9/2003 |

OTHER PUBLICATIONS

International Search Report and Written Opinion—PCT/US2015/031428—ISA/EPO—Aug. 12, 2015.

*Primary Examiner* — Thomas Lee
*Assistant Examiner* — Aaron J Browne
(74) *Attorney, Agent, or Firm* — Loza & Loza LLP

(57) ABSTRACT

Systems and methods for controlling a frequency of a clock signal by selectively swallowing pulses in the clock signal are described herein. In one embodiment, a method for adjusting a frequency of a clock signal comprises receiving the clock signal, and swallowing pulses in the clock signal according to a repeating clock-swallowing pattern, wherein the pattern is defined by a sequence of numbers.

15 Claims, 11 Drawing Sheets

(56) References Cited

U.S. PATENT DOCUMENTS

| | | | |
|---|---|---|---|
| 2005/0083098 A1* | 4/2005 | Matsui | G06F 1/08 |
| | | | 327/291 |
| 2009/0164827 A1* | 6/2009 | Komninakis | H03L 7/00 |
| | | | 713/500 |
| 2012/0187991 A1 | 7/2012 | Sathe et al. | |
| 2014/0117959 A1* | 5/2014 | Costa | H02M 3/157 |
| | | | 323/282 |
| 2014/0254734 A1 | 9/2014 | Abdelmoneum et al. | |
| 2015/0002197 A1 | 1/2015 | Chatterjee et al. | |

\* cited by examiner

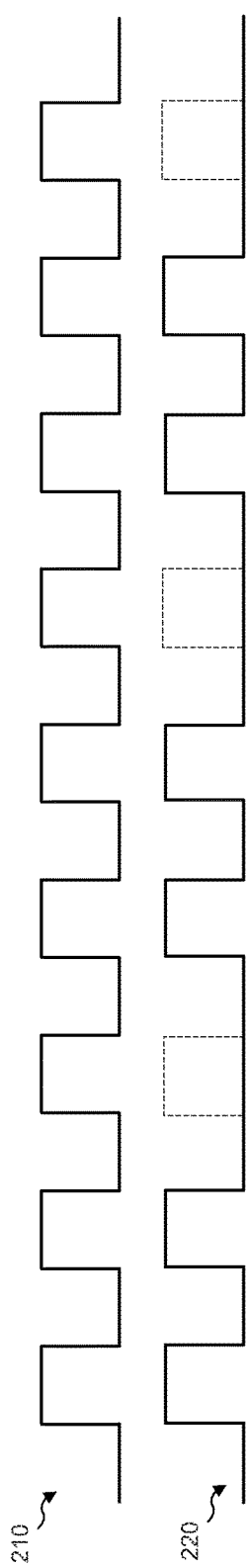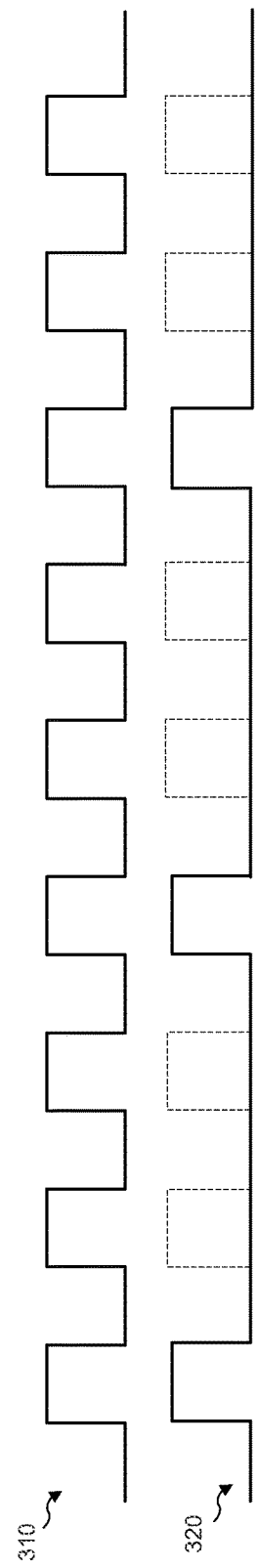

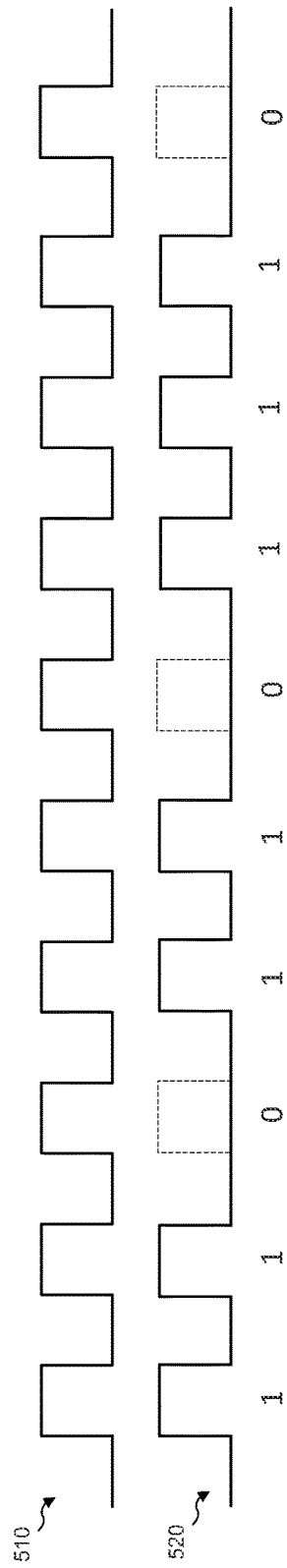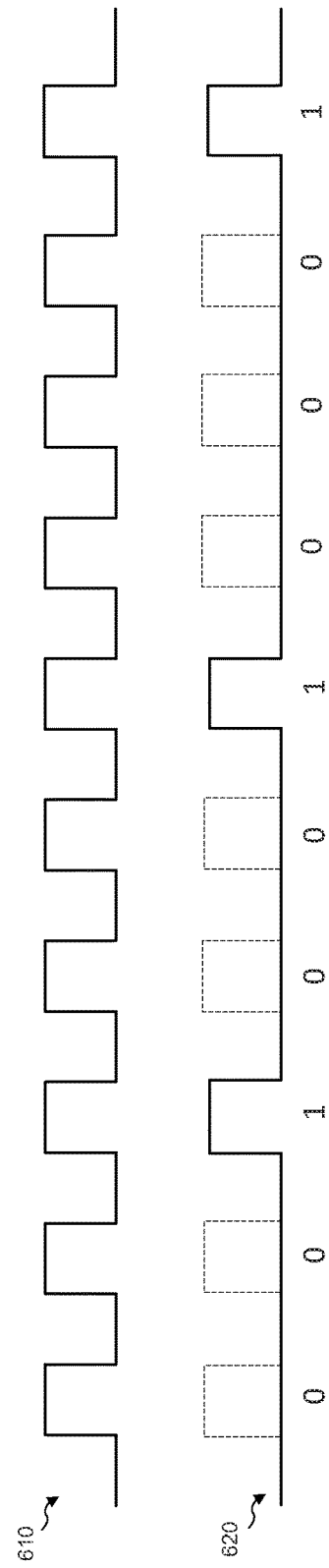

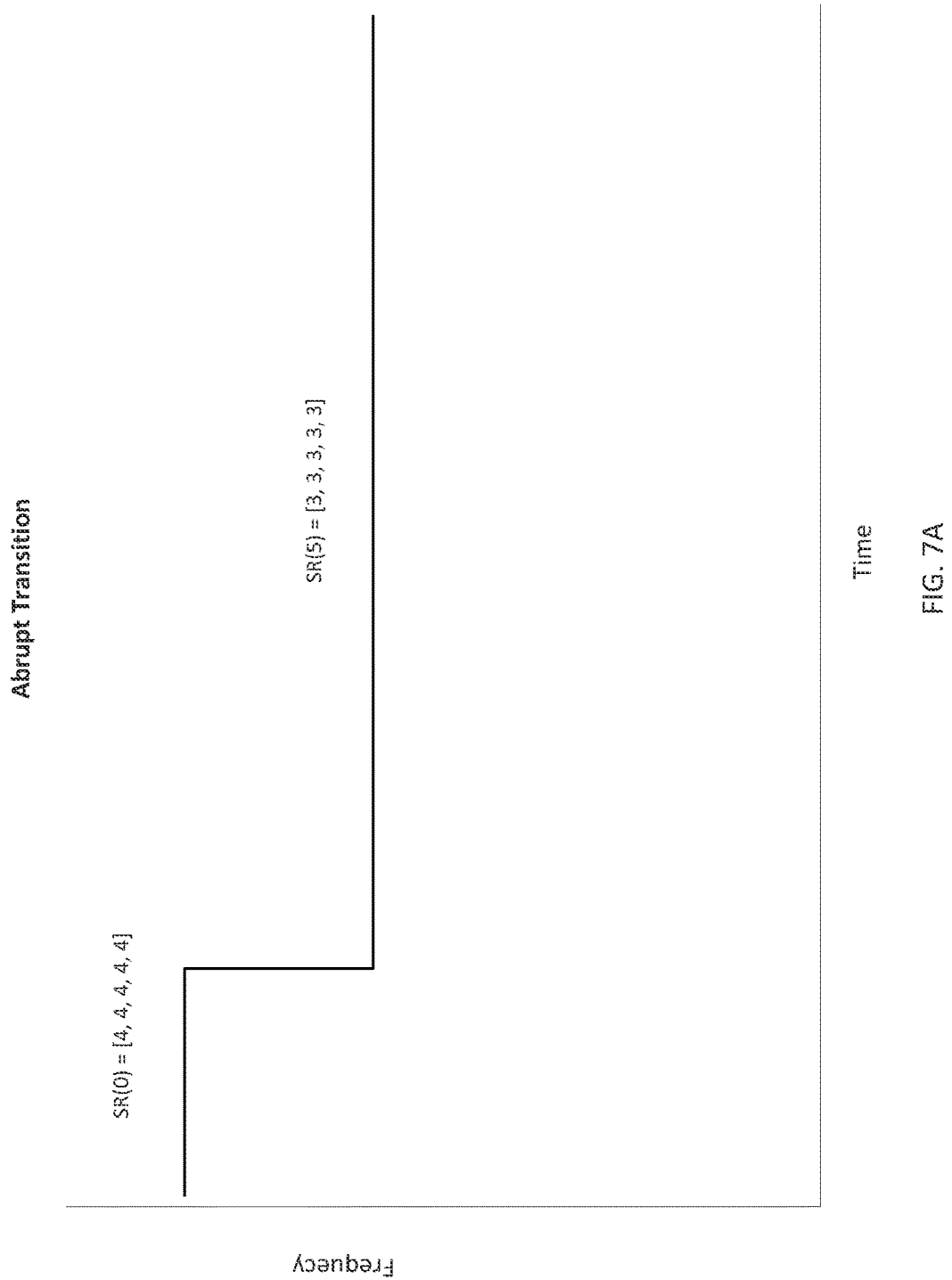

US 9,582,027 B2

CLOCK SWALLOWING DEVICE FOR REDUCING VOLTAGE NOISE

BACKGROUND

Field

Aspects of the present disclosure relate generally to frequency control, and more particularly, to clock swallowing.

Background

There are many applications in which it is desirable to control the frequency of a clock signal input to a circuit (e.g., central processing unit (CPU)). For example, the frequency of the clock signal may be adjusted by a temperature control system to prevent the temperature of a chip from becoming too high. In this example, the temperature control system may monitor the temperature of the chip using one or more temperature sensors, and reduce (throttle back) the clock frequency when the temperature exceeds a threshold. The reduction in the clock frequency reduces the dynamic power consumption of the circuit, which, in turn, reduces the temperature. In another example, the circuit may be a memory interface that supports multiple data rates. In this example, the clock frequency may be adjusted to change the data rate.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for adjusting a frequency of a clock signal is described herein. The method comprises receiving the clock signal, and swallowing pulses in the clock signal according to a repeating clock-swallowing pattern, wherein the pattern is defined by a sequence of numbers.

A second aspect relates to an apparatus for adjusting a frequency of a clock signal. The apparatus comprises means for receiving the clock signal, and means for swallowing pulses in the clock signal according to a repeating clock-swallowing pattern, wherein the pattern is defined by a sequence of numbers.

A third aspect relates to a clock swallowing device. The clock swallowing device comprises a counter configured to receive a clock signal comprising a sequence of pulses, and to increment a count for each of the pulses. The clock swallowing device also comprises a shift register configured to store a plurality of numbers, wherein one of the plurality of numbers is in a read position of the shift register at a time, and a clock swallower configured to selectively swallow the pulses in the clock signal. The clock swallowing device further comprises a comparison circuit, wherein, for each of the pulses, the comparison circuit is configured to compare the count with a number currently in the read position of the shift register, to determine whether to enable or disable swallowing of the pulse by the clock swallower based on the comparison, and to reset the counter and shift the plurality of numbers in the shift register if the count equals the number currently in the read position of the shift register.

A fourth aspect relates to a method of temperature control. The method comprises measuring a temperature of a circuit, determining an adjustment to a frequency of a clock signal based on the measured temperature, and swallowing pulses in the clock signal according to the frequency adjustment.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 2 shows an example of a clock signal before and after clock swallowing according to an embodiment of the present disclosure.

FIG. 3 shows another example of a clock signal before and after clock swallowing according to an embodiment of the present disclosure.

FIG. 5 shows an example of a clock signal before and after clock swallowing using the clock swallowing device in FIG. 4 according to an embodiment of the present disclosure.

FIG. 6 shows another example of a clock signal before and after clock swallowing using the clock swallowing device in FIG. 4 according to an embodiment of the present disclosure.

FIG. 7A shows an example of an abrupt transition from a first frequency to a second frequency according to an embodiment of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

There are many applications in which it is desirable to control the frequency of a clock signal input to a circuit (e.g., central processing unit (CPU)). For example, the frequency of the clock signal may be adjusted to control the temperature of a chip, adjust the data rate of the circuit, etc.

In one approach, the clock frequency is adjusted by generating the clock signal using a phase locked loop (PLL), and adjusting a parameter of the PLL to adjust the clock frequency. A drawback of this approach is that the PLL requires a relatively long period of time to relock when the frequency is changed. Therefore, the PLL may not be suitable for applications requiring fast transitions in the clock frequency.

In another approach, the clock signal is input to a fractional clock divider that adjusts the frequency of the clock signal. A drawback of this approach is that the clock path in the fractional clock divider may contain many logic gates (e.g., multiplexers, flip-flops, etc.), which introduce a large amount of jitter into the clock signal. The large jitter may make this approach unsuitable for high-speed applications since a circuit handling high data rates has tight timing constraints, and therefore tolerates less jitter. In this case, the large jitter may cause data sampling errors and/or other timing errors in the circuit.

Embodiments of the present disclosure overcome drawbacks of the previous two approaches by adjusting the clock frequency using clock swallowing, in which pulses in the clock signal are selectively swallowed to achieve a desired clock frequency, as discussed further below.

Figure 1:
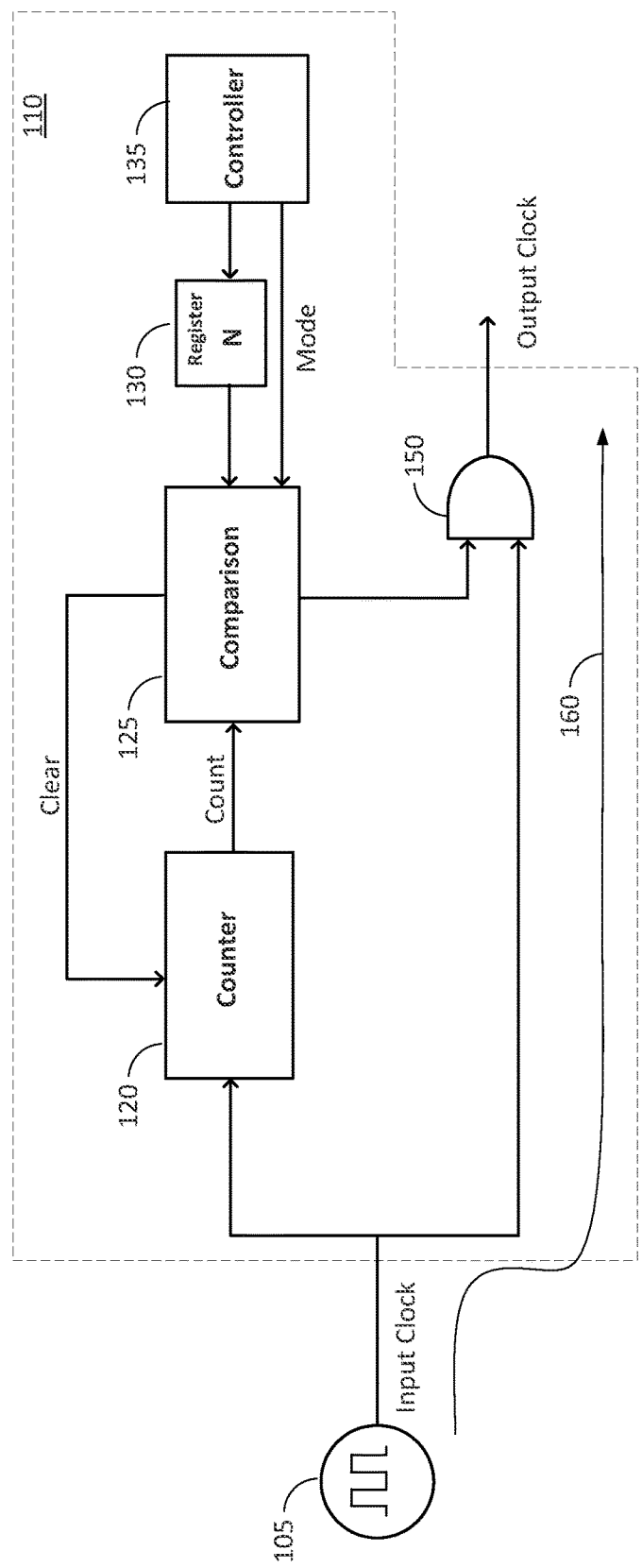
FIG. 1 shows a clock swallowing device according to an embodiment of the present disclosure.

FIG. 1 shows a clock swallowing device 110 according to an embodiment of the present disclosure. The clock swallowing device 110 comprises a counter 120, a comparison circuit 125, a register 130, a controller 135, and a clock swallower 150. The clock swallowing device 110 is configured to receive a clock signal from a clock source 105 (e.g., a PLL, crystal oscillator, etc.), to adjust the frequency of the clock signal by selectively swallowing pulses of the clock signal, and to output the frequency-adjusted clock signal to a circuit (e.g., CPU) that uses the clock signal (e.g., for data sampling, data processing, etc.).

The counter 120 is configured to count a number of pulses in the input clock signal, and to output the count to the comparison circuit 125. The comparison circuit 125 is configured to compare the count from the counter 120 with a value N in the register 130, and determine whether to swallow a pulse in the input clock signal based on the comparison. If the comparison circuit 125 determines to swallow the pulse, then the comparison circuit 125 outputs a swallow-enable signal to the clock swallower 150. Otherwise, the comparison circuit 125 outputs a swallow-disable signal to the swallow circuit 150.

In the example shown in FIG. 1, the clock swallower 150 comprises an AND gate having one input coupled to the input clock signal and another input coupled to the comparison circuit 125. In this example, the AND gate swallows a pulse when the comparison circuit 125 outputs a logic zero to the AND gate and passes a pulse when the comparison circuit 125 outputs a logic one to the AND gate. Thus, in this example, a swallow-enable signal is a logic zero and a swallow-disable signal is a logic one.

In one aspect, the comparison circuit 125 is configured to operate in a first mode or a second mode under the control of the controller 135. In the first mode, the comparison circuit 125 outputs a swallow-enable signal (e.g., logic zero) to the clock swallower 150 (e.g., AND gate) each time the count from the counter 120 reaches N, and outputs a swallow-disable signal when the count is not equal to N. The comparison circuit 125 also clears the counter 120 each time the count reaches N to reset the counter 120 (e.g., reset the count to zero). Thus, in the first mode, the clock swallowing device 110 swallows every Nth pulse of the input clock, thereby reducing the clock frequency by 1/N. For example, in the first mode, the clock frequency may be reduced by ⅓ by setting N equal to three. This is illustrated in FIG. 2, in which the clock swallower 150 swallows every third pulse of the input clock signal 210 to produce an output clock signal 220 having ⅔ (approximately 66.6%) the frequency of the input clock signal 210. The swallowed pulses are shown in dashed line in FIG. 2.

In the second mode, the comparison circuit 125 outputs a swallow-disable signal (e.g., logic zero) to the clock swallower 150 (e.g., AND gate) each time the count from the counter 120 reaches N, and outputs a swallow-enable signal when the count is not equal to N. The comparison circuit 125 also clears the counter 120 each time the count reaches N to reset the counter 120 (e.g., reset the count to zero). Thus, in the second mode, the clock swallowing device 110 swallows N−1 pulses per N pulses of the input clock signal (i.e., passes every Nth pulse of the input clock signal), thereby reducing the clock frequency by (N−1)/N. For example, in the second mode, the clock frequency may be reduced by ⅔ by setting N equal to three. This is illustrated in FIG. 3, in which the clock swallower 150 swallows two pulses per three pulses (i.e., passes every third pulse) of the input clock signal 310 to produce an output clock signal 320 having ⅓ (approximately 33.3%) the frequency of the input clock signal 310. The swallowed pulses are shown in dashed line in FIG. 3.

The controller 135 is configured to control the clock swallowing to achieve a desired clock frequency. In one aspect, the controller 135 may receive an indication of a desired frequency (e.g., from a temperate control system). In response, the controller 135 loads a value of N corresponding to the desired frequency into the register 130 and instructs the comparison circuit 125 to operate in the mode corresponding to the desired frequency. For example, if the desired frequency is ⅔ (approximately 66.6%) the input clock frequency, then the controller 135 may load a value of three into the register 130 and instruct the comparison circuit 125 to operate in the first mode. In another example, if the desired frequency is ⅓ (approximately 33.3%) input clock frequency, then the controller 135 may load a value of three into the register 130 and instruct the comparison circuit 125 to operate in the second mode.

If the desired frequency is equal to the input clock frequency, then the controller 135 may instruct the comparison circuit 125 to constantly output a swallow-disable signal (e.g., logic one) to the clock swallower 150 (e.g., AND gate). In this case, the clock signal passes through clock swallower 150 without undergoing clock swallowing.

In one embodiment, the controller 135 may comprise a lookup table that maps each one of a plurality of frequencies to a corresponding N value and mode of operation (the first mode or the second mode). For example, the lookup table may map a frequency equal to ⅔ the input clock frequency to an N value of three and the first mode. In this embodiment, when the controller 135 receives an indication of a desired frequency (e.g., from a temperature control system), the controller 135 determines the corresponding N value and mode of operation using the lookup table. The controller 135 then loads the corresponding N value into the register 130 and instructs the comparison circuit 125 to operate in the corresponding mode of operation (the first mode or the second mode).

The clock swallowing device 110 is capable of adjusting the frequency of the clock signal much faster than a PLL. This is because, unlike a PLL, the clock swallowing device 110 does not need to be relocked when the frequency changes. Further, the clock swallowing device 110 adds much less jitter to the clock signal compared with a fractional clock divider. This is because the clock swallowing device 110 has one logic gate (e.g., AND gate) in the clock path 160 while a fractional clock divider has many logic gates (e.g., multiplexers, flip-flops, etc.) in the clock path that accumulatively add a large amount of jitter to the clock signal. The logic (e.g., comparison circuit 125) in the clock swallowing device 110 that determines whether to swallow a clock pulse is located outside of the clock path 160.

The clock swallowing device 110 may provide relatively coarse frequency control within certain frequency ranges. For example, in the first mode, the clock swallowing device 110 outputs a frequency equal to 66.6% the input clock frequency when N equals three, and outputs a frequency equal to 75% the input clock frequency when N equals four. In this example, the clock swallowing device 110 may not be capable of outputting a frequency that is between 66.6% and 75% the input clock frequency.

Coarse frequency control may result in a sudden large change in the output clock frequency since the spacing between adjacent frequencies may be large. The sudden large change in the output clock frequency may cause a large current transient (i.e., large derivative of current with respect to time) on a power rail coupled to the circuit using the clock signal. The large current transient may, in turn, cause a large amount of voltage noise (e.g., voltage droop) on the power rail, which can result in logic errors and/or timing errors in the circuit. For example, the large current transient may exceed the step-current load capability of a power management integrated circuit (PMIC) supplying power to the power rail, causing the voltage on the power rail to droop.

Further, coarse frequency control may limit the precision with which temperature can be controlled, resulting in reduced performance. As discussed above, a temperature control system may control temperature by adjusting the clock frequency (and hence the dynamic power, which is a function of clock frequency). Because the temperature control system controls temperature by controlling the clock frequency, the precision with which the system controls temperatures depends on the granularity of frequency control with coarser frequency control resulting in less precise temperature control.

Figure 4:
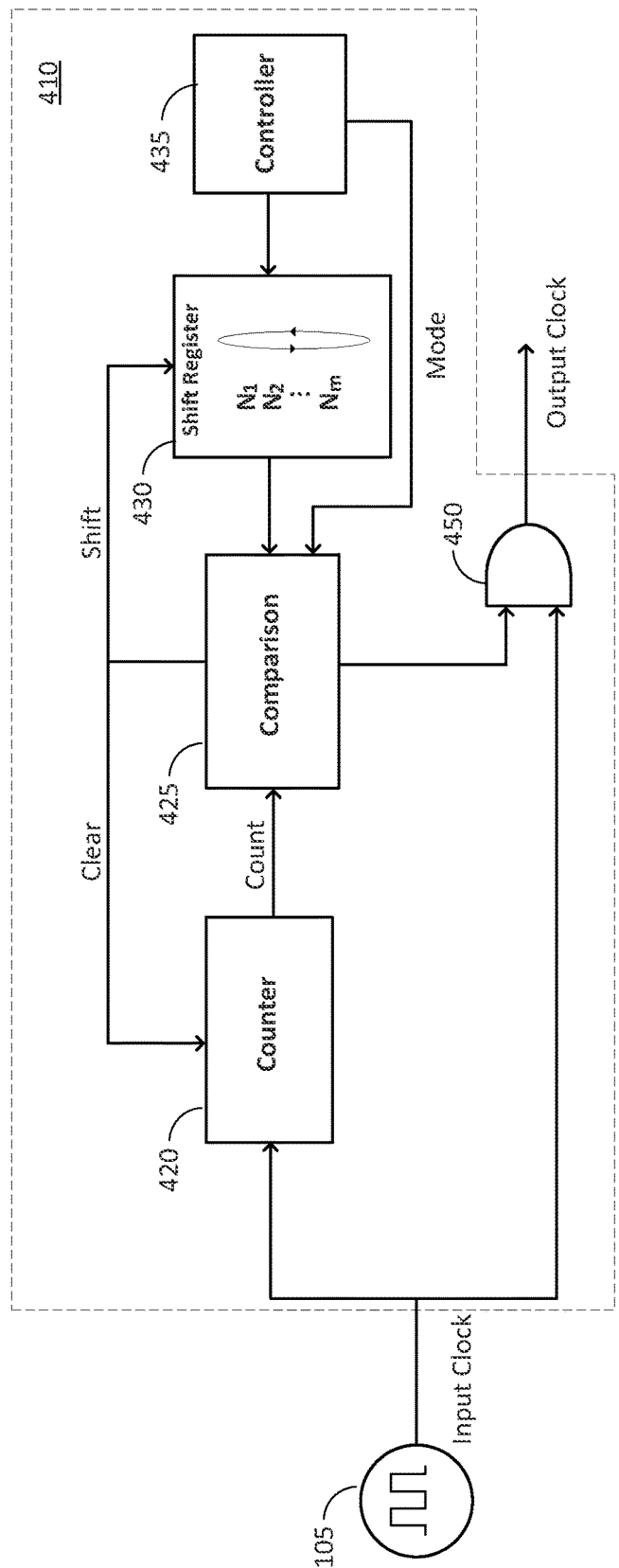
FIG. 4 shows a clock swallowing device with fine frequency control according to an embodiment of the present disclosure.

FIG. 4 shows a clock swallowing device 410 that provides fine frequency control according to an embodiment of the present disclosure. The clock swallowing device 410 comprises a counter 420, a comparison circuit 425, a shift register 430, a controller 435, and a clock swallower 450. As discussed further below, the shift register 430 allows the clock swallowing device 410 to adjust the clock frequency with finer granularity than the clock swallowing device 110 in FIG. 1.

The shift register 430 is configured to store m count values $N_1$ to $N_m$, and to shift the values $N_1$ to $N_m$ by one position each time the shift register 430 receives a shift signal from the comparison circuit 425. In one aspect, the shift register 430 is a circular shift register, in which the values $N_1$ to $N_m$ are shifted in a circular pattern and each value returns to the same position in the shift register 430 after m shifts. The counter 420 is configured to count a number of pulses in the input clock signal, and to output the count to the comparison circuit 425. The counter 420 is also configured to reset each time the counter 420 receives a clear signal from the comparison circuit 425.

The comparison circuit 425 may operate in a first mode or a second mode under the control of the controller 435. The first mode is described below followed by the second mode.

In the first mode, the comparison circuit 425 compares the count from the counter 420 with a count value in a read position in the shift register 430. For ease of discussion, it will be assumed that the first value $N_1$ is initially in the read position, and therefore that the comparison circuit 425 initially compares the count from the counter 420 with the first value $N_1$. When the count from the counter 420 does not equal the first value $N_1$, the comparison circuit 425 outputs a swallow-disable signal (e.g., logic one) to the clock swallower 450 (e.g., AND gate). When the count from the counter 425 reaches the first value $N_1$, the comparison circuit 425 outputs a swallow-enable signal (e.g., logic zero) to the clock swallower 450 (e.g., AND gate). The comparison circuit 425 also clears the counter 420 and shifts the values $N_1$ to $N_m$ in the shift register 420 by one position, causing the second value $N_2$ to move into the read position.

The comparison circuit 425 then compares the count from the counter 420 with the second value $N_2$ in the shift register 430. When the count does not equal the second value $N_2$, the comparison circuit 425 outputs a swallow-disable signal to the clock swallower 450. When the count reaches the second value $N_2$, the comparison circuit 425 outputs a swallow-enable signal to the clock swallower 450. The comparison circuit 425 also clears the counter 420 and shifts the values $N_1$ to $N_m$ in the shift register 420 by one position, causing the third value $N_3$ to move into the read position. The comparison circuit 425 repeats the above steps for the remaining values $N_3$ to $N_m$ in the shift register 430. After outputting the swallow-enable signal for the last value $N_m$, the comparison circuit 425 shifts the values in the shift register 430 by one position, causing the first values $N_1$ to return to the read position. The above process may then be repeated.

Thus, the m count values $N_1$ to $N_m$ define a clock-swallowing pattern that is repeated each time the clock swallowing device 410 cycles through the m count values $N_1$ to $N_m$. For example, count values of 3, 3 and 4 define a clock-swallowing pattern represented by 1101101110, where a zero represents a pulse swallow and a one represents a pulse pass. In this example, the pattern results in an output frequency that is 70% the input clock frequency. This is illustrated FIG. 5, in which the clock swallower 450 swallows pulses in the input clock signal 510 according to the pattern 1101101110 to produce an output clock signal 520 having 70% the frequency of the input clock signal 510. The swallowed pulses are shown in dashed line in FIG. 5. Thus, the clock swallowing device 410 is capable of outputting a frequency that is 70% the input clock frequency by repeating the above pattern, which is not possible using the clock swallowing device 110 in FIG. 1.

In general, for a given set of count values $N_1$ to $N_m$ in the first mode, the resulting output clock frequency is given by:

$$f_{out} = \left( \frac{\sum_{i=1}^{m}(N_i - 1)}{\sum_{i=1}^{m} N_i} \right) f_{in} \qquad (1)$$

where $f_{out}$ is the output clock frequency, and $f_{in}$ is the input clock frequency. For example, inputting count values of 3, 3 and 4 into equation (1) results in an output frequency that is equal to 70% the input clock frequency, which is in agreement with the discussion above. In other words, the clock swallowing device 410 cycles through the count values $N_1$ to $N_m$ over many cycles. In each cycle, the clock swallowing device 410 passes $\Sigma_{i=1}^{m}(N_i-1)$ pulses and swallows m pulses of the clock signal, resulting in the output clock frequency given by equation (1).

The second mode of operation will now be described. In the second mode, the comparison circuit 425 compares the count from the counter 420 with a count value in the read position in the shift register 430. For ease of discussion, it will be assumed that the first value $N_1$ is initially in the read position, and therefore that the comparison circuit 425 initially compares the count from the counter 420 with the first value $N_1$. When the count from the counter 420 does not equal the first value $N_1$, the comparison circuit 425 outputs a swallow-enable signal (e.g., logic zero) to the clock swallower 450 (e.g., AND gate). When the count from the counter 420 reaches the first value $N_1$, the comparison circuit 425 outputs a swallow-disable signal (e.g., logic one) to the clock swallower 450 (e.g., AND gate). The comparison circuit 425 also clears the counter 420 and shifts the values $N_1$ to $N_m$ in the shift register 420 by one position, causing the second value $N_2$ to move into the read position.

The comparison circuit 425 then compares the count from the counter 420 with the second value $N_2$ in the shift register 430. When the count does not equal the second value $N_2$, the comparison circuit 425 outputs a swallow-enable signal to the clock swallower 450. When the count reaches the second value $N_2$, the comparison circuit 425 outputs a swallow-disable signal to the clock swallower 450. The comparison circuit 425 also clears the counter 420 and shifts the values $N_1$ to $N_m$ in the shift register 420 by one position, causing the third value $N_3$ to move into the read position. The comparison circuit 425 repeats the above steps for the remaining values $N_3$ to $N_m$ in the shift register 430. After outputting the swallow-disable signal for the last value $N_m$, the comparison circuit 425 shifts the values in the shift register 430 by one position, causing the first values $N_1$ to return to the read position. The above process may then be repeated.

Thus, the m count values $N_1$ to $N_m$ define a clock-swallowing pattern in the second mode that is repeated each time the clock swallowing device 410 cycles through the m count values $N_1$ to $N_m$. For example, count values of 3, 3 and 4 define a clock-swallowing pattern represented by 0010010001, where a zero represents a pulse swallow and a one represents a pulse pass. In this example, the pattern results in an output frequency that is 30% the input clock frequency. This is illustrated FIG. 6, in which the clock swallower 450 swallows pulses in the input clock signal 610 according to the pattern 0010010001 to produce an output clock signal 620 having 30% the frequency of the input clock signal 610. The swallowed pulses are shown in dashed line in FIG. 6.

In general, for a given set of count values $N_1$ to $N_m$ in the second mode, the resulting output clock frequency is given by:

$$f_{out} = \left(\frac{m}{\sum_{i=1}^{m} N_i}\right) f_{in} \quad (2)$$

where $f_{out}$ is the output clock frequency, and $f_{in}$ is the input clock frequency. For example, inputting count values of 3, 3 and 4 into equation (2) results in an output clock frequency equal to 30% the input clock frequency, which is in agreement with the discussion above. In other words, the clock swallowing device 410 cycles through the count values $N_1$ to $N_m$ over many cycles. In each cycle, the clock swallowing device 410 passes m pulses and swallows $\Sigma_{i=1}^{m}(N_i-1)$ pulses of the clock signal, resulting in the output clock frequency given by equation (2).

A given set of count values defines patterns in the first and second modes that are the logical inverse of each other. For example, the set of count values 3, 3 and 4 defines the pattern 1101101110 in the first mode and defines the pattern 0010010001 in the second mode, which is the logical inverse of the pattern 1101101110. Thus, the first mode may be considered the logical inverse of the second mode. In general, frequency adjustments between 50% and 100% of the input clock frequency may be made using the first mode, and frequency adjustments between 0% and 50% of the input clock frequency may be made using the second mode. Either mode may be used to achieve an output clock frequency that is 50% (half) the input clock frequency.

The controller 435 is configured to control the clock swallowing to achieve a desired clock frequency. In one aspect, the controller 435 may receive an indication of a desired frequency (e.g., from a temperate control system). In response, the controller 435 loads a set of count values $N_1$ to $N_m$ corresponding to the desired frequency into the shift register 430 and instructs the comparison circuit 425 to operate in the mode corresponding to the desired frequency. For example, if the desired frequency is 70% of the input clock frequency, then the controller 135 may load the values 3, 3 and 4 into the shift register 430 and instruct the comparison circuit 425 to operate in the first mode. In another example, if the desired frequency is 30% the input clock frequency, then the controller 435 may load the values 3, 3 and 4 into the shift register 430 and instruct the comparison circuit 425 to operate in the second mode.

If the desired frequency is equal to the input clock frequency, then the controller 435 may instruct the comparison circuit 425 to constantly output a swallow-disable signal (e.g., logic one) to the clock swallower 450 (e.g., AND gate). In this case, the clock signal passes through clock swallower 450 without undergoing clock swallowing.

In one embodiment, the controller 435 may comprise a lookup table that maps each one of a plurality of frequencies to a corresponding set of count values $N_1$ to $N_m$ and mode of operation (the first mode or the second mode). In this embodiment, when the controller 135 receives an indication of a desired frequency (e.g., from a temperature control system), the controller 435 determines the corresponding set of count values $N_1$ to $N_m$ and mode of operation using the lookup table. The controller 435 then loads the corresponding set of count values $N_1$ to $N_m$ value into the shift register 430 and instructs the comparison circuit 425 to operate in the corresponding mode of operation (the first mode or the second mode).

The clock swallowing device 410 is capable of providing much finer frequency control than the clock swallowing device 110 in FIG. 1 using the shift register 430. The length m of the shift register 430 (i.e., number of count values $N_1$ to $N_m$ in the shift register 430) determines the granularity of frequency control with a larger length m corresponding to finer granularity. Thus, the length m of the shift register 430 may be selected based on a desired granularity for frequency control. The finer frequency control provided by the clock swallowing device 410 in FIG. 4 allows, among other things, a temperature control system to more precisely control temperature, as discussed further below.

In one embodiment, the length m of the shift register 430 may be fixed. In this embodiment, the number of count values $N_1$ to $N_m$ for different output frequencies may be equal to m even though the clock-swallowing patterns for some of the frequencies may be defined using a smaller number of count values. For example, m may be equal to six. In this example, an output frequency equal to 70% the input clock frequency may correspond to count values 3, 3, 4, 3, 3 and 4, which is obtained by repeating the count values 3, 3 and 4 discussed above. Also, in this example, an output frequency equal to 60% the input clock frequency may correspond to count values 2, 3, 2, 3, 2 and 3, which is obtained by repeating the count values 2 and 3 three times. It is to be appreciated that the length m of the shift register 430 is not limited to this example, and may be any length. Thus, the number of count values for a particular output frequency may be greater than the minimum number of count values required to define the clock-swallowing pattern for the output frequency. Using a fixed length m for the shift register 430 simplifies the circuitry in the shift register 430.

As discussed above, a large current transient due to changes in the output clock frequency can cause a large amount of voltage noise on the power rail. In this regard, the fine granularity of the clock swallowing device 410 may be exploited to reduce the current transient, and hence the voltage noise on the power rail. In one embodiment, when the output clock signal changes from a first frequency to a second frequency, the clock swallowing device 410 sequentially transitions the output clock signal to each of one or more intermediate frequencies to provide a gradual transition from the first frequency to the second frequency instead of an abrupt transition from the first frequency to the second frequency. The gradual transition reduces the current transient, and hence the voltage noise on the power rail.

FIG. 7A shows an example of an abrupt transition from a first frequency to a second frequency. In this example, the first frequency is equal to 75% the input clock frequency and the second frequency is equal to 66% the input clock frequency, the length m of the shift register 430 is five, and the clock swallowing device 410 is operating in the first mode. In the abrupt transition, the clock swallowing device 410 transitions directly from the first frequency to the second frequency, in which the first frequency corresponds to a first set (denoted SR(0)) of count values 4, 4, 4, 4 and 4, and the second frequency corresponds to a second set (denoted SR(5)) of count values 3, 3, 3, 3 and 3. The abrupt transition may cause a large current transient, and hence a large amount of voltage noise on the power rail.

Figure 7B:
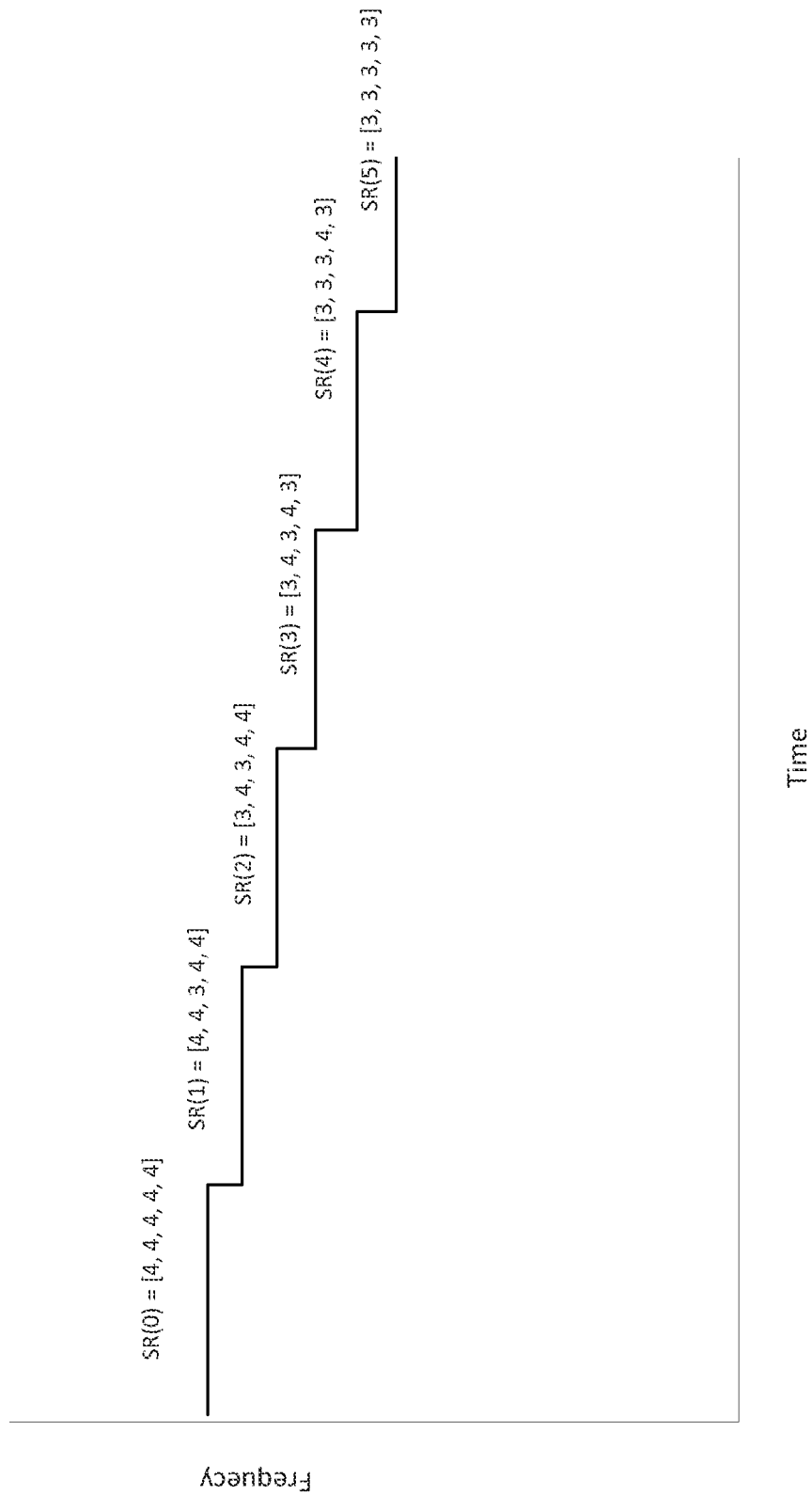
FIG. 7B shows an example of a gradual transition a first frequency to a second frequency according to an embodiment of the present disclosure.

FIG. 7B shows an example of a gradual transition from the first frequency to the second frequency. In the gradual transition, the clock swallowing device 410 sequentially transitions to each one of four intermediate frequencies in going from the first frequency to the second frequency. The intermediate frequencies correspond to four sets (denoted SR(1) to SR(4)) of count values, as shown in FIG. 7B. In this example, each transition involves changing one of the count values from a four to a three. The clock swallowing device 410 may stay at each intermediate frequency for a predetermined period of time before transitioning to the next intermediate frequency or transitioning to the second frequency (for the last intermediate frequency). The predetermined period of time may correspond to a predetermined number of clock cycles or a predetermined number of shifts of the shift register 430.

In one embodiment, when the controller 435 receives an indication to change from a first frequency to a second frequency (e.g., from a temperature control system), the controller 435 may determine whether the clock swallowing device 410 supports one or more frequencies between the first and second frequencies (i.e., one or more intermediate frequencies). If so, then the controller 435 may sequentially transition the output clock signal to each of the one or more intermediate frequencies in going from the first frequency to the second frequency. The controller 435 may do this, for example, by sequentially loading the set of count values for each intermediate frequency into the shift register 430 and spending a predetermined amount of time at each intermediate frequency. The controller 435 may spend the same amount of time at each intermediate frequency or a different amount of time at each intermediate frequency. After the last intermediate frequency, the controller 435 may load the set of count values for the second frequency into the load register 430 to cause the clock swallowing device 410 to output a clock frequency at the second frequency.

If the clock swallowing does not support one or more intermediate frequencies, then the controller 435 may transition the clock swallowing device 410 from the first frequency directly to the second frequency. This may occur, for example, when the first and second frequencies are close together.

In another embodiment, when the controller 435 receives an indication to change from a first frequency to a second frequency (e.g., from a temperature control system), the controller 435 may determine the difference between the first and second frequencies, and compare the difference to a threshold. If the difference is equal to or below the threshold, then the controller 435 may transition the clock swallowing device 410 from the first frequency directly to the second frequency. If the difference is above the threshold, then the controller 435 may sequentially transition the output clock signal to each of one or more intermediate frequencies to provide a gradual transition from the first frequency to the second frequency, as discussed above.

It is to be appreciated that the clock swallowing device 410 may comprise more than one shift register 430. For example, the clock swallowing device 410 may comprise first and second shift registers, in which one of the shift registers is coupled to the comparison circuit 425 at a time (e.g., by one or more switches). In this example, when the first shift register is coupled to the comparison circuit 425, the second shift register may be loaded with count values $N_1$ to $N_m$ for a new output clock frequency. When the second shift register is ready, the second shift register may be coupled to the comparison circuit 425. Similarly, when the second shift register is coupled to the comparison circuit 425, the first shift register may be loaded with count values $N_1$ to $N_m$ for a new output clock frequency. When the first shift register is ready, the first shift register may be coupled to the comparison circuit 425.

Figure 8:
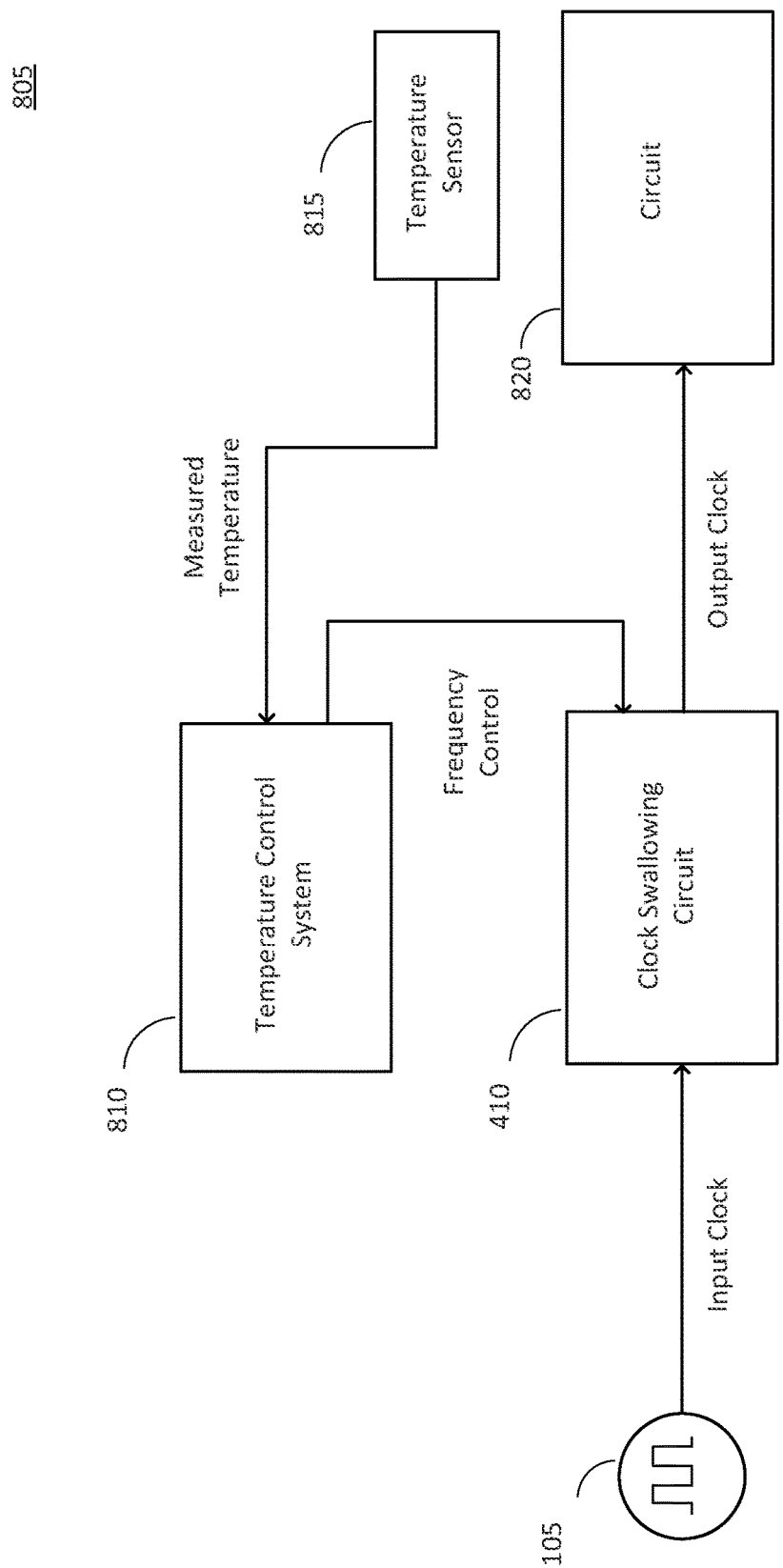
FIG. 8 shows an example of a system with temperature control according to an embodiment of the present disclosure.

As discussed above, the clock swallowing device 410 may be used in temperature control applications. In this regard, FIG. 8 shows a system 805 comprising the clock swallowing device 410, the clock source 105, a temperature control system 810, a temperature sensor 815, and a circuit 820. The system 805 may be integrated on a die.

The clock swallowing device 410 receives an input clock signal from the clock source 105 (e.g., a PLL, crystal oscillator, etc.), adjusts the frequency of the clock signal under the control of the temperature control system 810, and outputs the frequency-adjusted clock signal to the circuit 820 (e.g., CPU). The circuit 820 uses the frequency-adjusted output clock signal, for example, for data sampling, data processing, etc.

The temperature sensor 815 measures a temperature of the circuit 820 and outputs the measured temperature to the temperature control system 810. The temperature sensor 815 may be located near the circuit 820 or within the circuit 820 to obtain an accurate temperature reading of the circuit 820. The temperature control system 810 controls the output frequency of the clock swallowing device 410 based on the measured temperature to prevent the temperature of the circuit 820 from becoming too high, as discussed further below.

Although one temperature sensor 815 is shown in FIG. 8 for ease of illustration, it is to be appreciated that the system 805 may comprise a plurality of temperature sensors. For example, the system 805 may comprises a plurality of temperature sensors at different locations near and/or within the circuit 820, and the temperature control system 810 may receive a plurality of temperature measurements from the temperature sensors. In this example, the temperature control system 810 may control temperature based on the highest temperature measurement, or an average of some or all of the temperature measurements.

As discussed above, the temperature control system 810 controls the temperature of the circuit 820 by adjusting the output frequency of the clock swallowing device 410. For example, when the measured temperature rises above a certain temperature, the temperature control system 810 may adjust the output clock frequency downward to reduce the temperature. The temperature control system 810 may adjust the output clock frequency by sending a frequency control signal to the clock swallowing device 410 indicating an adjustment to the output clock frequency. The controller 435 in the clock swallowing device 410 receives the frequency control signal and adjusts the output clock frequency accordingly.

A better understanding of the temperature control system 810 may be gained by briefly reviewing the relationship between the temperature of the circuit 820 and the frequency of the output clock signal. The temperature of the circuit 820 is a function of the power dissipated by the circuit 820, which comprises dynamic power and leakage power. The dynamic power is caused by switching (toggling) of logic gates (e.g., transistors) in the circuit 820, and the leakage power is caused by current leakage in the circuit 820. The dynamic power of the circuit 820 may be given by:

$$P_{dyn} = \tfrac{1}{2} CV^2 f_{out} \quad (3)$$

where $P_{dyn}$ is the dynamic power, C is the capacitance of the circuit 820, V is the supply voltage, and $f_{out}$ is the frequency of the output clock signal, which is input to the circuit 820 from the clock swallowing device 410. As shown in equation (3), the dynamic power of the circuit 820 is proportional to the output clock frequency of the clock swallowing device 410, and can therefore be adjusted by adjusting the output clock frequency. Finer control over the output clock frequency provides finer control over the dynamic power of the circuit 820, and hence temperature. Thus, the fine frequency control provided by the clock swallowing device 410 allows the temperature control system 810 to more precisely control the temperature of the circuit 820.

Figure 9A:
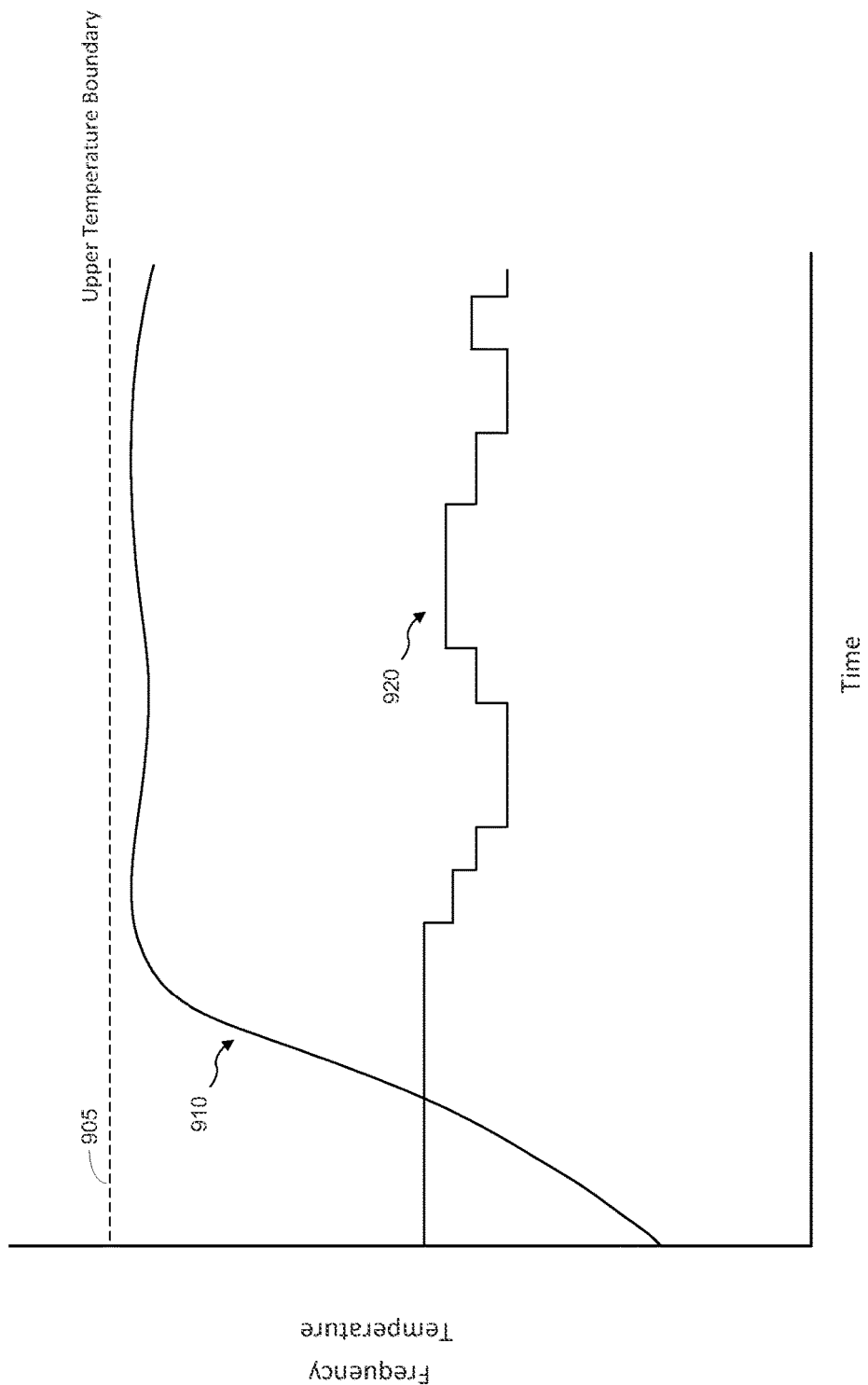
FIG. 9A shows an example of temperature control using fine frequency control according to an embodiment of the present disclosure.

FIG. 9A is a plot illustrating an example of temperature control using fine frequency control according to an embodiment of the present disclosure. FIG. 9A shows an example of temperature 910 of the circuit 820 over time, an example of output clock frequency 920 of the clock swallowing device 410 over time, and an upper temperature boundary 905. The upper temperature boundary 905 may represent a maximum safe operating temperature of the circuit 820. Above the upper temperature boundary 905, the circuit 820 may enter thermal runaway, which can potentially damage the circuit 820. To prevent thermal runaway, the temperature control system 810 may be configured to keep the temperature of the circuit 910 below the upper temperature boundary 905.

In the example in FIG. 9A, the temperature 910 of the circuit 820 rises steadily toward the upper temperature boundary 905. When the temperature 910 approaches the upper temperature boundary 905, the temperature control system 810 begins to adjust the output clock frequency 920 downward to reduce the dynamic power of the circuit 820 and, hence, the temperature 910 to prevent the temperature 910 from crossing the upper temperature boundary 905. The temperature control system 810 then adjusts the output clock frequency 920 to maintain the temperature 910 close to the upper temperature boundary 905 without crossing the upper temperature boundary 905, as shown in FIG. 9A. This is possible because the fine frequency control provided by the clock swallowing device 410 allows the temperature control system 810 to make fine adjustments to the output clock frequency, and hence fine adjustments to dynamic power according to equation (3). This, in turn, allows the temperature control system 810 to precisely control the temperature 910. As a result, the temperature control system 810 allows the circuit 820 to steadily operate near the upper temperature boundary 905 without crossing the upper temperature boundary, thereby optimizing performance of the circuit 820.

Figure 9B:
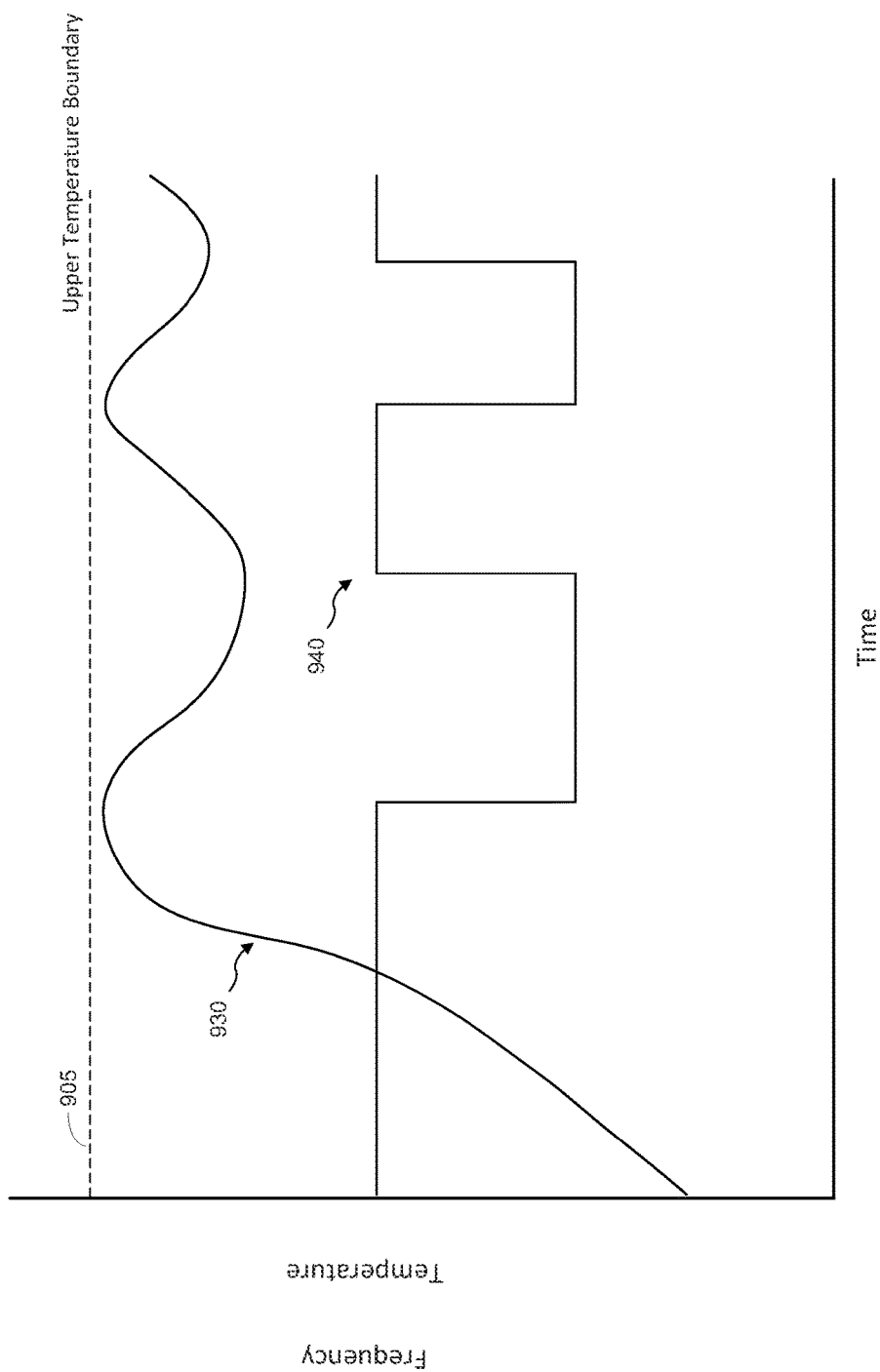
FIG. 9B shows an example of temperature control using coarse frequency control according to an embodiment of the present disclosure.

In contrast to FIG. 9A, FIG. 9B is a plot illustrating an example temperature control using coarse frequency control. In this case, the temperature control system 810 is only able to change the output clock frequency 940 between two widely spaced frequencies. As a result, the temperature control system 810 is not able to finely control the dynamic power of the circuit 820, and the temperature 930 fluctuates over a relatively large range, as shown in FIG. 9B. Because of the large fluctuations in the temperature 930, the circuit 820 cannot steadily operate near the upper temperature boundary 905, resulting in lower performance of the circuit 820 compared to FIG. 9A.

Figure 10:
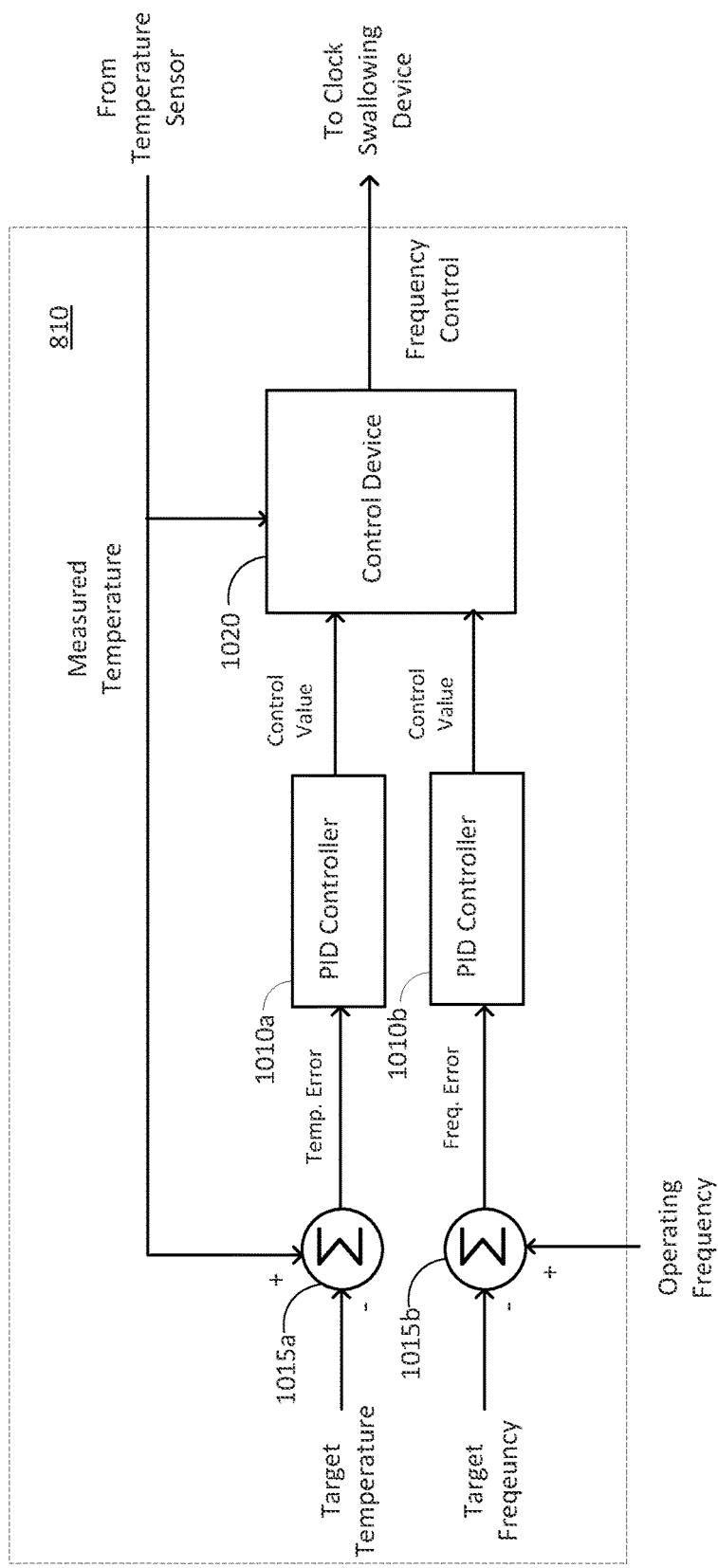
FIG. 10 shows a temperature control system according to an embodiment of the present disclosure.

FIG. 10 shows an exemplary implementation of the temperature control system 810 according to an embodiment of the present disclosure. In this embodiment, the temperature control system 810 comprises a first subtractor 1015a, a first proportional-integral-derivative (PID) controller 1010a, a second subtractor 1015b, a second PID controller 1010b, and a control device 1020. The temperature control system 810 is configured to keep the temperature of the circuit 820 close to a target temperature (e.g., 90° C.) when the temperature reaches the target temperature, as further discussed below. The target temperature is below the upper temperature boundary.

In operation, the control device 1020 monitors the measured temperature from the temperature sensor 815. If the temperature is well below the target temperature (e.g., 20° C.), then the control device 1020 does not control the output clock frequency. In this case, the output clock frequency may be equal to a target frequency. The target frequency may be equal to the input clock frequency, in which case, the clock swallowing device 410 may pass the clock signal without clock swallowing. This may be done, for example, to maximize the processing speed of the circuit 820. In another example, the target frequency may be below the input clock frequency based on a desired data rate for the circuit 820, in which case, the clock swallowing device 410 may reduce the frequency of the clock signal to the target frequency.

When the temperature is within a certain range of the target temperature, the control device 1020 may activate a temperature control loop or a frequency control loop depending on whether the temperature is above or below the target temperature. More particularly, when the temperature is above the target temperature, the control device activates the temperature control loop to reduce the temperature, as discussed further below.

When the temperature control loop is activated, the first subtractor 1015a determines the difference between the target temperature and the measured temperature to produce a temperature error. The temperature error is input to the first PID controller 1010a, which generates a control value based on a weighted sum of the present temperature error, an accumulated temperature error, and a rate of change of the temperature error. The control device 1020 converts the control value into a corresponding downward adjustment in the output clock frequency, and outputs a corresponding frequency control signal to the clock swallowing device 410 to adjust the output clock frequency accordingly. In this aspect, the proportional coefficient ($K_p$), integral coefficient ($K_i$), and/or the derivative coefficient ($K_d$) of the first PID controller 1010a may be tuned through experimentation and/or simulations to optimize the temperature control loop.

The reduction in the output clock frequency by the temperature control loop causes the temperature to fall. When the temperature drops below the target temperature, the control device 1020 may activate the frequency control loop and deactivate the temperature control loop.

When the frequency control loop is activated, the second subtractor 1015b determines the difference between the target frequency and the operating frequency (actual output clock frequency) of the circuit 820 to produce a frequency error. The operating frequency may be provided by the circuit 820 and/or the clock swallowing device 410. The frequency error is input to the second PID controller 1010b, which generates a control value based on a weighted sum of the present frequency error, an accumulated frequency error, and a rate of change of the frequency error. The control device 1020 converts the control value into a corresponding upward adjustment in the output clock frequency, and outputs a corresponding frequency control signal to the clock swallowing device 410 to adjust the output clock frequency accordingly. In this aspect, the proportional coefficient ($K_p$), integral coefficient ($K_i$), and/or the derivative coefficient ($K_d$) of the second PID controller 1010b may be tuned through experimentation and/or simulations to optimize the frequency control loop.

The increase in the output clock frequency by the frequency control loop causes the temperature to increase. When the temperature crosses the target temperature, the control device 1020 may activate the temperature control loop and deactivate the frequency control loop to reduce the temperature. The temperature control loop reduces the output clock frequency, causing the temperature to fall. When the temperature falls below the target temperature, the control device 1020 may activate the frequency control loop and deactivate the temperature control loop to increase the output clock frequency. This process may be repeated to keep the temperature of the circuit 820 close to the target temperature.

Thus, the temperature control system 810 may alternate between the temperature control loop and the frequency control loop, in which the temperature control loop is activated when the temperature is above the target temperature, and the frequency control loop is activated when the temperature is below the target temperature. In other words, when the temperature rises above the target temperature, the temperature control loop reduces the output clock frequency to reduce the temperature. When the temperature drops below the target temperature, the frequency control loop increases the output clock frequency to increase performance (e.g., data processing speed) of the circuit 820.

The fine frequency control provided by the clock swallowing device 410 allows the temperature control system 810 to keep the temperature of the circuit 820 close to the target temperature. This allows the target temperature to be placed close to the upper temperature boundary without the temperature crossing the upper temperature boundary, thereby allowing the circuit 820 to operate near the upper temperature boundary to optimize performance of the circuit 820.

Although FIG. 10 shows separate PID controllers 1010a and 1010b for the temperature control loop and frequency control loop, it is to be appreciated that the temperature control loop and frequency control loop may share the same PID controller. In this example, the proportional coefficient ($K_p$), integral coefficient ($K_i$), and/or the derivative coefficient ($K_d$) of the PID controller may be optimized for both temperature control and frequency control through experimentation and/or simulations. Also, the outputs of the first and second subtractors 1015a and 1015b may be coupled to the shared PID controller through a multiplexer. When the temperature control loop is activated, the multiplexer may couple the output of the first subtractor 1015a to the input of the PID controller, and, when the frequency control loop is activated, the multiplexer may couple the output of the second subtractor 1015b to the input of the PID controller.

Figure 11:
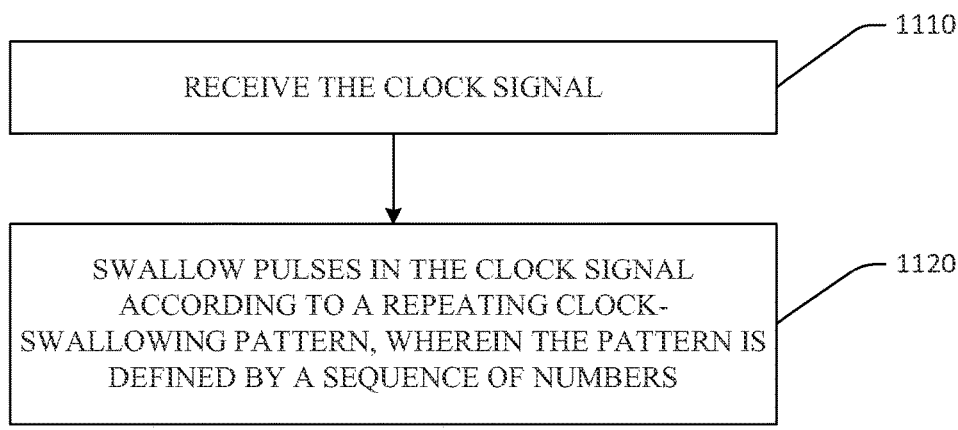
FIG. 11 is a flowchart of a method for adjusting a frequency of a clock signal according to an embodiment of the present disclosure.

FIG. 11 shows a method 1100 for adjusting a frequency of a clock signal according to an embodiment of the present disclosure. The method 1100 may be performed, for example, by the clock swallowing device 410.

In step 1110, the clock signal is received. For example, the clock signal may be received from a clock source (e.g., clock source 105).

In step 1120, pulses in the clock signal are swallowed according to a repeating clock-swallowing pattern, wherein the pattern is defined by a sequence of numbers. For example, the sequence of numbers may define spaces between adjacent pulse swallows in the clock signal. In this example, the sequence of numbers 3, 3 and 4 may define the clock-swallowing pattern 1101101110, where a one represents a pulse pass and a zero represents a pulse swallow. In another example, the sequence of numbers may define spaces between adjacent pulse passes in the clock signal. In this example, the sequence of numbers 3, 3 and 4 may define the clock-swallowing pattern 0010010001, where a one represents a pulse pass and a zero represents a pulse swallow.

In certain embodiments, the sequence of numbers includes at least two different numbers, at least three different numbers, or at least four different numbers. In certain embodiments, the sequence of numbers may comprise at least two numbers, at least three numbers, at least four numbers, or at least five numbers.

Figure 12:
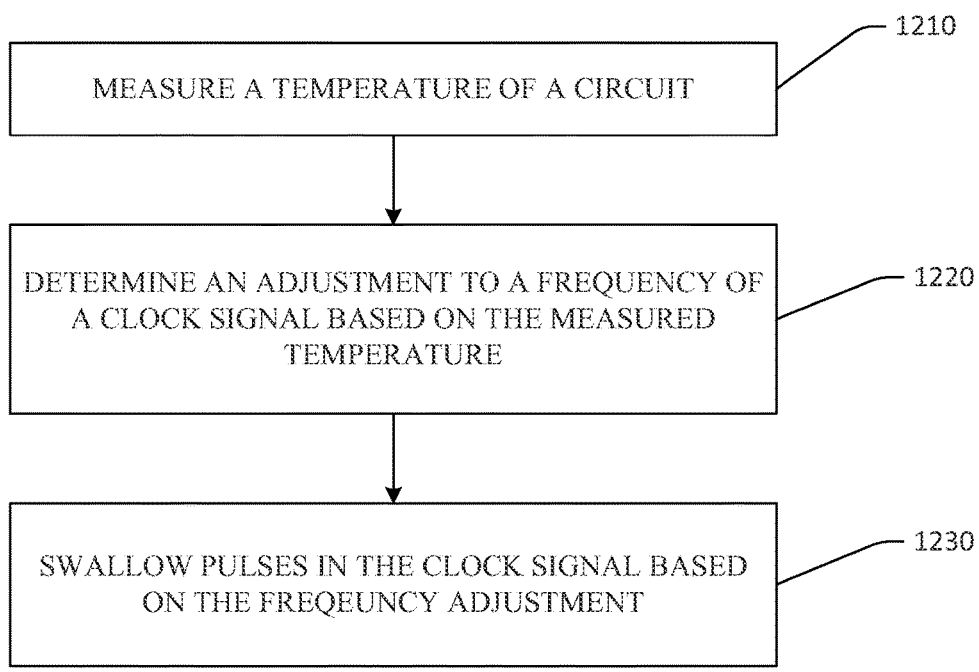
FIG. 12 is a flowchart of a method for controlling temperature according to an embodiment of the present disclosure.

FIG. 12 shows a method 1200 for controlling temperature according to an embodiment of the present disclosure. The method 120 may be performed by the temperature control system 810, the temperature sensor 815, and the clock swallowing device 410.

In step 1210, a temperature of a circuit is measured. For example, the temperature of the circuit (e.g., circuit 820) may be measured by a temperature sensor (e.g., temperature sensor 815) located near or within the circuit.

In step 1220, an adjustment to a frequency of a clock signal is determined based on the measured temperature. For example, the frequency adjustment may be based on a temperature error between the measured temperature and a target temperature. In this example, if the measured temperature is above the target temperature, then the frequency of the clock signal may be adjusted downward (i.e., reduced) to reduce the temperature of the circuit.

In step 1230, pulses in the clock signal are swallowed based on the frequency adjustment. For example, the pulses may be swallowed by a clock swallowing device (e.g., clock swallowing device 410) according to a repeating clock-swallowing pattern, wherein the pattern is defined by a sequence of numbers.

It is to be appreciated that clock swallowing may be described using other terminology, and therefore that the present disclosure is not limited to the particular terminology used herein to described the concept of clock swallowing. For example, swallowing a clock pulse may be described as swallowing a clock cycle, dropping a clock pulse, blocking a clock pulse, or removing a clock pulse.

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for adjusting a frequency of a clock signal, comprising:
   receiving the clock signal;
   loading a sequence of numbers into a register, wherein the sequence of numbers comprises at least two different numbers;
   swallowing pulses in the clock signal according to a repeating clock-swallowing pattern, wherein the pattern is defined by the sequence of numbers in the register, each number in the sequence defines a space between adjacent pulse swallows or a space between adjacent pulse passes, and, for each number in the sequence, the space defined by the number in the sequence corresponds to a number of pulses in the clock signal equal to one less than the number in the sequence.

2. The method of claim 1, wherein a frequency of the clock signal after swallowing is approximately equal to:

$$f_{out} = \left( \frac{\sum_{i=1}^{m}(N_i - 1)}{\sum_{i=1}^{m} N_i} \right) f_{in}$$

where $f_{out}$, is the frequency of the clock after swallowing, $f_{in}$ is a frequency of the clock signal before swallowing, $N_1$ to $N_m$ are the numbers in the sequence of numbers, and m is an integer.

3. The method of claim 1, wherein swallowing the pulses in the clock signal comprises:
cycling through the sequence of numbers in the register over a plurality of cycles; and for each of the cycles, performing the steps of:
for each of the numbers in the sequence, allowing a number of pulses in the clock signal to pass, wherein the number of the pulses that are allowed to pass is one less than the number in the sequence; and
for each of the numbers in the sequence, swallowing one pulse in the clock signal.

4. The method of claim 1, wherein a frequency of the clock signal after swallowing is approximately equal to:

$$f_{out} = \left( \frac{m}{\sum_{i=1}^{m} N_i} \right) f_{in}$$

where $f_{out}$ is the frequency of the clock after swallowing, $f_{in}$ is a frequency of the clock signal before swallowing, $N_1$ to $N_m$ are the numbers in the sequence of numbers, and m is an integer.

5. The method of claim 1, wherein swallowing the pulses in the clock signal comprises:
cycling through the sequence of numbers in the register over a plurality of cycles; and
for each of the cycles, performing the steps of:
for each of the numbers in the sequence, swallowing a number of pulses in the clock signal, wherein the number of the pulses that are swallowed is one less than the number in the sequence; and
for each of the numbers in the sequence, allowing one pulse in the clock signal to pass.

6. An apparatus for adjusting a frequency of a clock signal, comprising:
means for receiving the clock signal;
means for loading a sequence of numbers into a register, wherein the sequence of numbers comprises at least two different numbers; and
means for swallowing pulses in the clock signal according to a repeating clock-swallowing pattern, wherein the pattern is defined by the sequence of numbers in the register, each number in the sequence defines a space between adjacent pulse swallows or a space between adjacent pulse passes, and, for each number in the sequence, the space defined by the number in the sequence corresponds to a number of pulses in the clock signal equal to one less than the number in the sequence.

7. The apparatus of claim 6, wherein the means for swallowing the pulses is configured to:
cycle through the sequence of numbers in the register over a plurality of cycles; and
for each of the cycles, perform the steps of:
for each of the numbers in the sequence, allow a number of pulses in the clock signal to pass, wherein the number of the pulses that are allowed to pass is one less than the number in the sequence; and
for each of the numbers in the sequence, swallow one pulse in the clock signal.

8. The apparatus of claim 6, wherein the means for swallowing the pulses is configured to:
cycle through the sequence of numbers in the register over a plurality of cycles; and
for each of the cycles, perform the steps of:
for each of the numbers in the sequence, swallow a number of pulses in the clock signal, wherein the number of the pulses that are swallowed is one less than the number in the sequence; and
for each of the numbers in the sequence, allow one pulse in the clock signal to pass.

9. A clock swallowing device, comprising:
a counter configured to receive a clock signal comprising a sequence of pulses, and to increment a count for each of the pulses;
a shift register configured to store a plurality of numbers, wherein one of the plurality of numbers is in a read position of the shift register at a time;
a clock swallower configured to selectively swallow the pulses in the clock signal; and
a comparison circuit, wherein, for each of the pulses, the comparison circuit is configured to compare the count with a number currently in the read position of the shift register, to determine whether to enable or disable swallowing of the pulse by the clock swallower based on the comparison, and to reset the counter and shift the plurality of numbers in the shift register if the count equals the number currently in the read position of the shift register.

10. The clock swallowing device of claim 9, wherein the plurality of numbers comprises at least two different numbers.

11. The clock swallowing device of claim 9, wherein the plurality of numbers comprises at least three numbers.

12. The clock swallowing device of claim 9, wherein, for each of the pulses, the comparison circuit is configured to disable swallowing of the pulse if the count is not equal to the number currently in the read position of the shift register, and to enable swallowing of the pulse if the count is equal to the number currently in the read position of the shift register.

13. The clock swallowing device of claim 9, wherein, for each of the pulses, the comparison circuit is configured to enable swallowing of the pulse if the count is not equal to the number currently in the read position of the shift register, and to disable swallowing of the pulse if the count is equal to the number currently in the read position of the shift register.

14. The clock swallowing device of claim 9, wherein the comparison circuit is configured to shift each of the plurality of numbers by one position in the shift register if the count equals the number currently in the read position of the shift register.

15. The clock swallowing device of claim 9, wherein the shift register comprises a circular shift register configured to shift the plurality of numbers in the shift register in a circular pattern.

* * * * *